United States Patent
Sasaki

(10) Patent No.: US 6,480,134 B1
(45) Date of Patent: Nov. 12, 2002

(54) ANALOG-TO-DIGITAL CONVERTER WITH A POWER SAVING CAPABILITY

(75) Inventor: Seiichiro Sasaki, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/532,029

(22) Filed: Mar. 21, 2000

(30) Foreign Application Priority Data

May 27, 1999 (JP) ............................................ 11-147510

(51) Int. Cl.$^7$ ................................................ H03M 1/36

(52) U.S. Cl. ...................................... 341/159; 341/155

(58) Field of Search ............................... 341/159, 160, 341/161, 155, 156, 158; 340/347

(56) References Cited

U.S. PATENT DOCUMENTS

| | | | |
|---|---|---|---|
| 4,417,233 A | * 11/1983 | Inoue et al. | ................. 340/347 |
| 5,345,237 A | * 9/1994 | Kouno et al. | ................. 341/156 |
| 5,684,485 A | * 11/1997 | Paillardet et al. | ........... 341/159 |
| 5,798,725 A | * 8/1998 | Okada | ........................ 341/158 |
| 6,002,356 A | * 12/1999 | Cooper | ........................ 341/160 |

* cited by examiner

Primary Examiner—Peguy Jeanpierre
Assistant Examiner—Joseph J Lauture
(74) Attorney, Agent, or Firm—Rabin & Berdo, P.C.

(57) ABSTRACT

An analog-to-digital (AD) converter includes a reference voltage generator for dividing a voltage between a first and a second reference potential to thereby generate low reference voltages of a low level, high reference voltages of a high level side, and medium reference voltages of a medium level. A first voltage comparator compares lower one of the medium reference voltages and an analog voltage input to the AD converter and outputs a first control signal if the analog voltage is higher than the lower medium reference voltage. A second voltage comparator compares higher one of the medium reference voltages and the analog voltage and outputs a second control signal if the analog voltage is lower than the higher medium reference voltage. In response to the second control signal, third voltage comparators each compare particular one of the low reference voltages and the analog voltage. Fourth voltage comparators each compare particular one of the medium voltages and the analog voltage. In response to the first control signal, fifth voltage comparators compare particular one of the high reference voltages and the analog voltage. A data output circuit generates and outputs digital data corresponding to the analog voltage on the basis of results of comparison output from the third, fourth and fifth voltage comparators.

14 Claims, 5 Drawing Sheets

ANALOG-TO-DIGITAL CONVERTER WITH A POWER SAVING CAPABILITY

BACKGROUND OF THE INVENTION

1. Field of the Invention

The present invention relates to an analog-to-digital (AD) converter for converting an analog voltage to digital data and more particularly to an improvement in the conversion accuracy of a parallel comparison type AD converter.

2. Description of the Background Art

To better understand the present invention, reference will be made to a conventional parallel comparison type AD converter, shown in FIG. 1. As shown, the AD converter is constructed to compare an analog voltage AI input thereto with n different reference voltages VR1, VR2, . . . , VRn at the same time and output binary digital data DO on the basis of the results of comparison, where n is a positive integer. The AD converter includes a voltage dividing circuit for producing the reference voltages VRi (i is a positive integer not exceeding n) and n CMOS (Complementary Metal Oxide Semiconductor) chopper type comparators $10_1$, $10_2$, . . . , $10_n$.

The voltage dividing circuit has n+1 resistors $1_1$, $1_2$, . . . , $1_{n+1}$ serially connected between a low reference potential VRB and a high reference potential VRT. The reference voltages VRi each appear at a junction between two adjoining resistors $1_i$ and $1_{i+1}$.

The comparators $10_1$ through $10_n$ are identical in configuration with each other. The comparator $10_1$, for example, includes analog switches 11 and 12 to which the reference voltage VR1 and analog voltage AI, respectively, are input. The switches 11 and 12 have outputs connected to a node N1. A capacitor 13 is connected to the node N1 at one end and connected to the input of an inverter 14 at the other end. The inverter 14 is implemented by a CMOS. A signal S1 representative of the result of comparison appears on the output of the inverter 14. The other comparators $10_2$ through $10_n$ also output respective signals S2 through Sn representative of the results of comparison.

An analog switch 15 is connected in parallel to the inverter 14. The switches 11, 12 and 15 are semiconductor switches implemented by, e.g., MOS transistors. The switches 11, 12 and 15 each turn on when a control signal is in its high level or turn off when it is in its low level. Specifically, a controller 2 feeds a clock signal CK1 to the switches 12 and 15 as a control signal and feeds the clock signal CK1 to the switch 11 via an inverter 16.

The comparators $10_1$ through $10_n$ have outputs connected to the input side of a data latch 3. The controller 2 feeds a clock signal CK2 to the data latch 3. The data latch 3 latches and then outputs the signals S1 through Sn output from the comparators $10_1$ through $10_n$ at the same time in response to the clock signal CK2.

An error correcting circuit 4 is connected to the output side of the data latch 3 for correcting the results of comparison output from the comparators $10_1$ through $10_n$ if they are illogical. The error correcting circuit 4 includes biinput AND gates $4_2$, . . . , $4_n$ each receiving the result of comparison from the lower AND gate preceding it and delivering its output to the higher AND gate following it.

An encoder 5 is connected to the output side of the error correcting circuit 4. The encoder 5 codes corrected signals CS1 through CSn output from the error correcting circuit 4 to generate the previously mentioned binary digital data DO.

In operation, when the clock signal CK1 output from the controller 2 is in its high level, the switches $1_2$ and $1_1$ of each comparator $10_1$ are turned on and turned off, respectively. As a result, the analog voltage AI appears on the node N1. Further, the switch 15 is turned on to short-circuit the input and output of the inverter 14 with the result that the input and output voltages of the inverter 14 become equal to a threshold voltage VT which is substantially one half of a power source voltage VDD. Consequently, the capacitor 13 is charged to a voltage VT−AI.

When the clock signal CK1 goes low, the switch 15 of each comparator $10_i$ is turned off to cause the inverter 14 to operate as an inverting amplifier. At the same time, the switches 11 and 12 are turned on and turned off, respectively, so that the reference voltage VRi is applied to the node N1. Because the capacitor 13 has already been charged to the voltage VT−AI, a voltage VT−AI+VRi is input to the inverter 14. Consequently, the signal Si output from the inverter 14 of the comparator $10_i$ is in its high level when the voltage AI is higher than the voltage VRi (AI>VRi) or in its low level when the former is lower than the latter (AI<VRi) That is, the outputs Si of the lower comparators $10_i$ with respect to the analog voltage AI are in its high level while the outputs Si of the higher comparators $10_i$ with respect to the same are in its low level.

As soon as the signals S1 through Sn output from the comparators $10_1$ through $10_n$ become stable, the controller 2 feeds the clock signal CK2 to the data latch 3. In response, the data latch 3 latches the signals S1 through Sn and then delivers them to the encoder 5 via the error correcting circuit 4. The encoder 5 transforms the signals CS1 through CSn output from the error correcting circuit 4 to the binary digital data DO.

As stated above, the conventional parallel comparison type AD converter is capable of converting the analog voltage AI to the digital data DO at the period of the clock signal CK1. However, the conventional AD converter leaves the following problems unsolved.

Because the switches 11 and 12 of each comparator $10_i$ are implemented by semiconductor switches, they are momentarily rendered conductive with a relatively low resistance at the same time during switching between the ON state and OFF state thereof. As a result, a penetrating current flows between the analog voltage AI and the reference voltage VRi to cause the potential on the node N1 to vary, lowering the conversion accuracy of the AD converter.

Further, if the difference in level between the analog voltage AI and the reference voltage VRi is small, a sufficient gain is not available with the inverter 14 of each comparator $10_1$. As a result, the output voltage of the inverter 14 becomes the threshold voltage VT to obstruct accurate detection. Moreover, the above penetrating current is apt to continuously flow from the power source potential VDD to the ground potential GND, aggravating power consumption.

Moreover, all the comparators $10_i$ operate at the same time without regard to the level of the analog voltage AI. This further aggravates power consumption due to the operation of needless ones of the comparators $10_i$.

SUMMARY OF THE INVENTION

It is therefore an object of the present invention to provide an AD converter having high conversion accuracy and capable of saving power.

An AD converter of the present invention includes a reference voltage generating circuit for dividing a voltage between a first and a second reference potential to thereby generate a plurality of low reference voltages of a low level, a plurality of high reference voltages of a high level, and a plurality of medium reference voltages of a medium level. A first voltage comparator compares lower one of the medium reference voltages and an analog voltage input to the AD converter and outputs a first control signal if the analog voltage is higher than the lower medium reference voltage. A second voltage comparator compares higher one of the medium reference voltages and the analog voltage and outputs a second control signal if the analog voltage is lower than the higher medium reference voltage. In response to the second control signal, a plurality of third voltage comparators each compare particular one of the low reference voltages and the analog voltage. A plurality of fourth voltage comparators each compare particular one of the medium voltages and the analog voltage. In response to the first control signal, a plurality of fifth voltage comparators each compare particular one of the high reference voltages and the analog voltage. A data outputting circuit generates and outputs digital data corresponding to the analog voltage on the basis of results of comparison output from the third, fourth and fifth voltage comparators.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
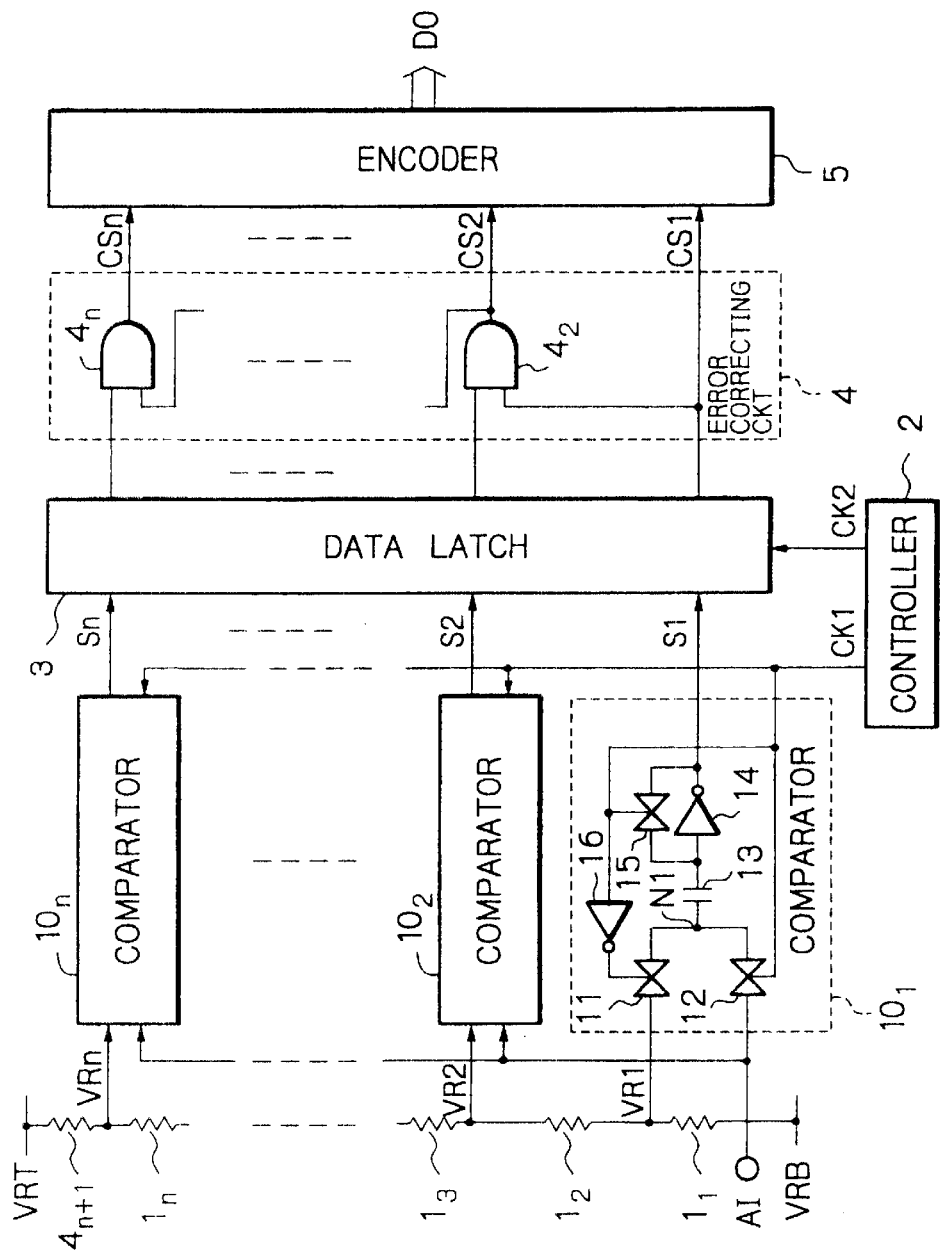
FIG. 1 is a block diagram schematically showing a conventional AD converter.
Figure 2:
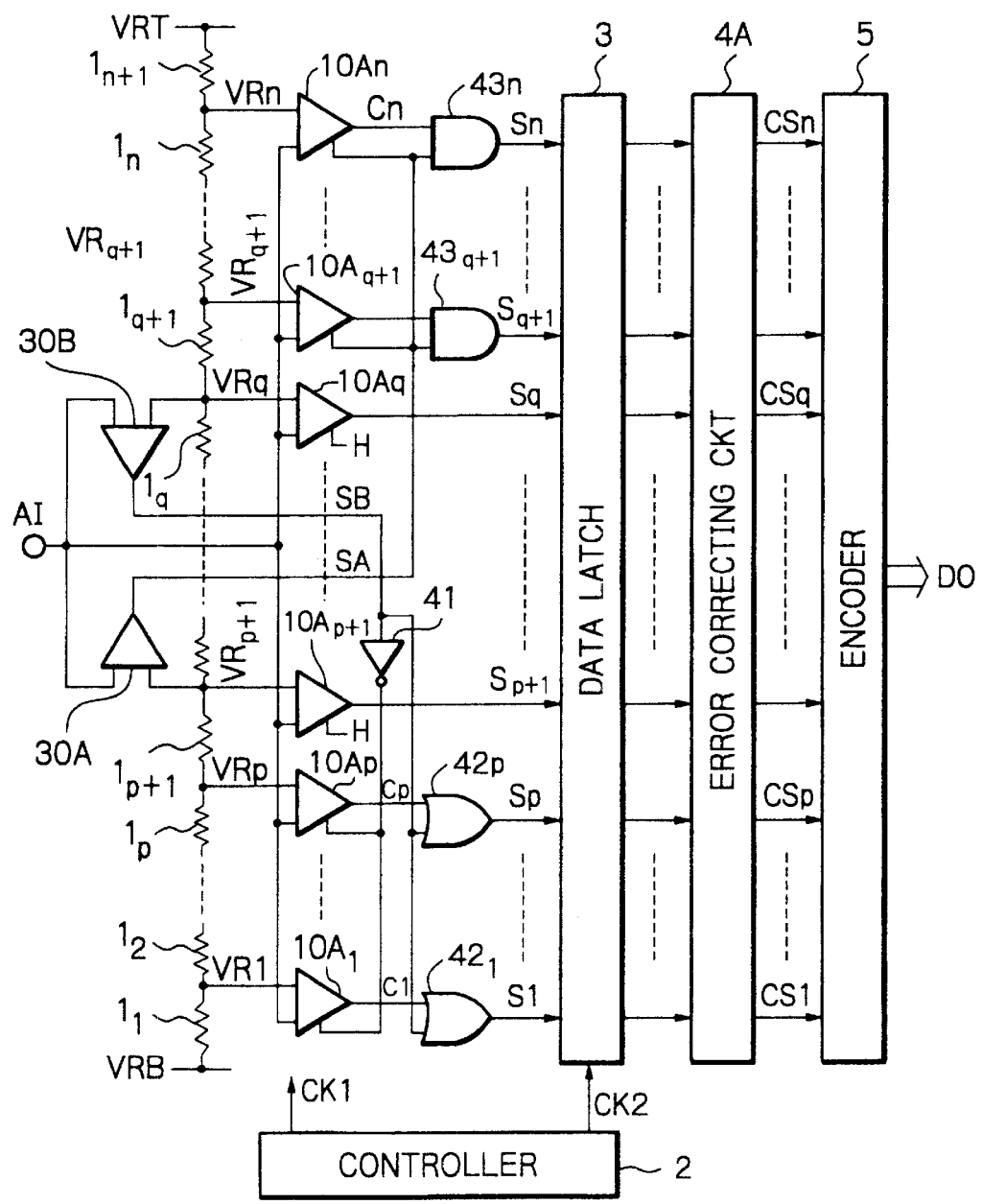
FIG. 2 is a block diagram schematically showing an AD converter embodying the present invention.

Referring to FIG. 2, an AD converter embodying the present invention is implemented as a parallel comparison type AD converter. In FIG. 2, structural elements like those shown in FIG. 1 are designated by identical reference numerals. As shown, the AD converter, like the conventional AD converter, compares an analog voltage AI input thereto with n different reference voltages VR1, VR2, . . . , VRn at the same time and outputs binary digital data DO on the basis of the results of comparison, where n is a positive integer. The AD converter includes a voltage dividing circuit or similar reference voltage generating means for outputting the reference voltages VRi (i is a positive integer not exceeding n) and n comparators or similar CMOS chopper type voltage comparing means $10A_1, 10A_2, \ldots, 10A_n$. The comparators $10A_1$ through $10A_n$ respectively compare the analog voltage AI with the reference voltages VRi and constitute third to fifth voltage comparing means, as will specifically be described later.

The voltage dividing circuit has n+1 resistors $1_1, 1_2, \ldots, 1_{n+1}$ serially connected between a low reference voltage VRB and a high reference voltage VRT. The reference voltages VRi each appear on a junction between two adjoining resistors $1_i$ and $1_{i+1}$.

The comparators $10A_1$ through $10A_n$ are identical in configuration with each other. In the illustrative embodiment, the comparators $10A_1$ through $10A_n$ are divided into three groups, i.e., a group of third comparators $10A_1$ through $10A_p$, a group of fourth comparators $10A_{p+1}$ through $10A_q$, and a group of fifth comparators $10A_{q+1}$ through $10A_n$. Reference voltages VR1 through VRp of a low level (low reference voltages hereinafter) are applied to the third comparators $10A_1$ through $10A_p$, respectively. Reference voltages VRp+1 through VRq of a medium level (medium reference voltages hereinafter) are applied to the fourth comparators $10A_{p+1}$ through $10A_q$, respectively. Further, reference voltages VRq+1 through VRn of a high level (high reference voltages hereinafter) are applied to the fifth comparators $10A_{q+1}$ through $10A_n$, respectively.

A differential comparator or similar first voltage comparing means 30A compares the analog voltage AI and the reference voltage VRp+1. Another differential comparator or similar second voltage comparing means 30B compares the analog voltage AI and the reference voltage VRq. When the analog voltage AI is lower than the reference voltage VRp+1, the comparator 30A renders the comparators $10A_{q+1}$ through $10A_n$ assigned to the high level inoperative. At the same time, the comparator 30A outputs a control signal SA having its low level for causing signals Sq+1 through Sn representative of the results of comparison to go low. When the analog voltage AI is higher than the reference voltage VRq, the comparator 30B renders the comparators $10A_1$ through $10A_p$ assigned to the low level inoperative and outputs a control signal SB having its high level for causing signals S1 through Sp representative of the results of comparison to go high. The comparator 30A has its output connected to the control terminals of the comparators $10A_{q+1}$ through $10A_n$ while the comparator 30B has its output connected to the control terminals of the comparators $10A_1$ through $10A_p$ via an inverter 41.

The comparators $10A_1$ through $10A_p$ have outputs connected to the first inputs of biinput OR gates $42_1$ through $42_p$, respectively. The comparator 30B has its output connected to the second inputs of the OR gates $42_1$ through $42_p$. Likewise, the comparators $10A_{q+1}$ through $10A_n$ have the outputs connected to the first inputs of biinput AND gates $43_{q+1}$ through $43_n$ while the comparator 30A has its output connected to the second inputs of the AND gates $43_{q+1}$ through $43_n$.

In the above configuration, the OR gates $42_1$ through $42_p$ respectively output signals S1 through Sp representative of the results of comparison between the analog voltage AI and the reference voltages VR1 through VRp. The comparators $10A_{p+1}$ through $10A_q$ respectively output signals Sp+1 through Sq representative of the results of comparison between the analog voltage AI and the reference voltages VRp+1 through VRq. Further, the AND gates $43_{q+1}$ through $43_n$ respectively output signals Sq+1 through Sn representative of the results of comparison between the analog voltage AI and the reference voltages VRq+1 through VRn. The signals S1 through Sn are input to a data latch 3. The data latch 3 latches and then outputs the signals S1 through Sn at the same time in response to a clock signal CK2 fed thereto from a controller 2.

The output side of the data latch 3 is connected to an error correcting circuit 4A. When the results of comparison output from the comparators $10A_1$ through $10A_n$ are illogical, the error correcting circuit 4A outputs corrected signals CS1 through CSn. Specifically, in the illustrative embodiment, the reference voltages VRi and VRi+1 applied to two adjoining comparators $10A_i$ and $10A_{i+1}$ have a relation of VRi<VRi+1. It follows that if the result of comparison output from the lower comparator $10A_i$ is representative of AI<VRi, then the result of comparison output from the higher comparator $10A_{i+1}$ should also be representative of AI<VRi+1. If the output of the lower comparator $10A_i$ is representative of AI<VRi, then the error correcting circuit 4A forcibly replaces the results of comparison output from all of the comparators $10A_{i+1}$ through $10A_n$ higher in level than the comparator $10A_i$ with AI<VRi+1 through VRn, respectively. This prevents the signals CS1 through CSn from being output when the results of comparison represented thereby are illogical.

An encoder or similar data outputting means 5 is connected to the output side of the error correcting circuit. The encoder 5 codes the signals CS1 through CSn output from the error correcting circuit 4A to binary digital data DO.

Figure 3:
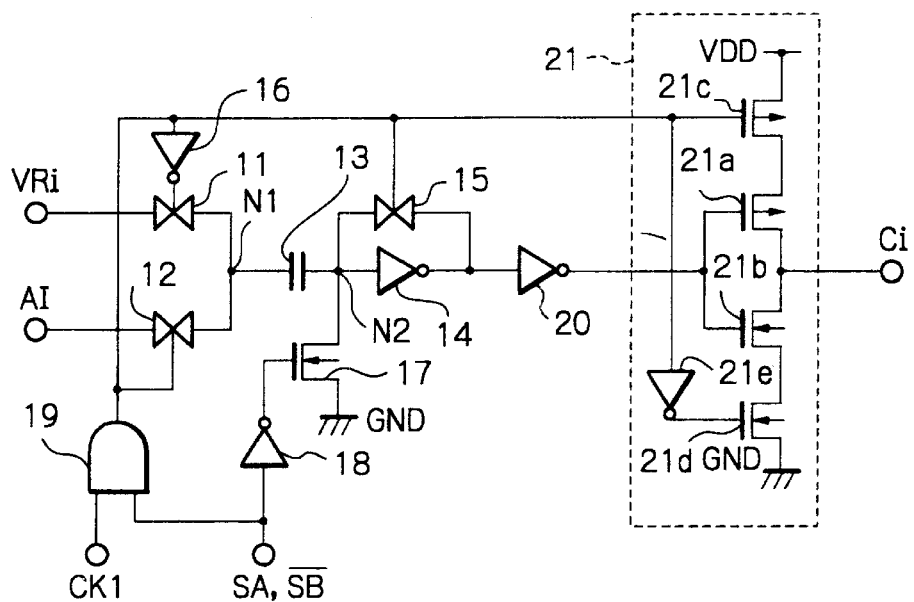
FIG. 3 is a schematic circuit diagram showing a specific configuration of one of comparators $10A_i$ included in the illustrative embodiment.

FIG. 3 shows a specific configuration of one of the comparators $10A_1$. As shown, the comparator 10A1 includes switches 11 and 12 to which the reference voltage VRi and analog voltage AI, respectively, are input. The switches 11 and 12 have outputs connected to a node N1. A capacitor 13 is connected to the node N1 at one end and connected to a node N2. An inverter 14 has its input connected to the node N2 and implemented by a CMOS. A switch 15 is connected in parallel to the inverter 14. The switches 11, 12 and 15 are implemented by MOS transistors or similar semiconductor switches, and each turns on when the control signal input thereto is in its high level or turns off when it is in its low level.

A switching NMOS transistor 17 is connected between the node N2 and the ground potential GND. The NMOS transistor 17 has a gate connected to the control terminal of the comparator $10A_1$ via an inverter 18. The comparator 30B feeds the control signal SB to the control terminals of the comparators $10A_1$ through $10A_p$ assigned to the low level via the inverter 41. The comparator 30A delivers the control signal SA to the control terminals of the comparators $10A_{q+1}$ through $10A_n$ assigned to the high level. The comparators $10_{p+1}$ through $10A_q$ assigned to the medium level have control terminals fixedly connected to "H (high level)".

The inverter 14 has an output connected to the input of an inverter 20 whose output is, in turn, connected to a clock controlled inverter 21. The inverter 21 is made up of a CMOS inverter having a PMOS transistor 21a and an NMOS transistor 21b, a switching PMOS transistor 21c connected to the power source potential VDD side of the CMOS, and a switching NMOS transistor 21d connected to the ground potential GND side of the CMOS. The clock signal CK1 is applied to the gate of the PMOS 21c via an AND gate 19 and is applied to the gate of the NMOS transistor 21d via an inverter 21e.

In the comparator $10A_1$ having the above configuration, when the control signal applied to the control terminal goes low, the output signal of the inverter 18 goes high and renders the NMOS transistor 17 conductive. As a result, the node N2 is fixed at the low level. Further, the output signal of the AND gate 19 goes low and turns off the switches 12 and 15, interrupting the comparing operation of the comparator $10A_1$.

Figure 4A:
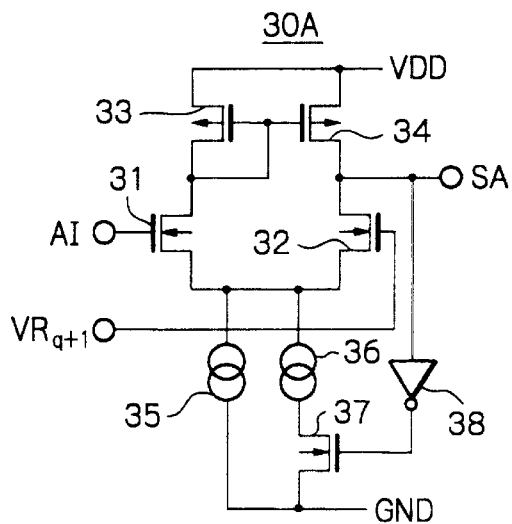
FIGS. 4A and 4B are schematic circuit diagrams respectively showing specific configurations of comparators 30A and 30B also included in the illustrative embodiment.
Figure 4B:
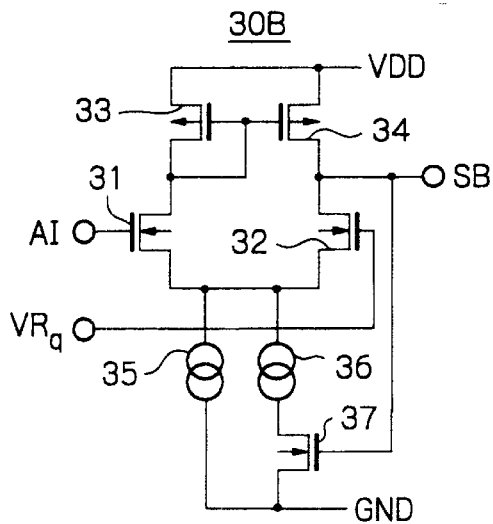

FIGS. 4A and 4B respectively show a specific configuration of the comparator 30A and a specific configuration of the comparator 30B. As shown in FIG. 4A, the comparator 30A includes an NMOS transistor 31 receiving the analog voltage AI via its gate and an NMOS transistor 32 receiving the reference voltage $VR_{p+1}$ via its gate. The NMOS transistors 31 and 32 have drains connected to the power source potential VDD via PMOS transistors 33 and 34, respectively. The PMOS transistors 33 and 34 have gates connected to the drain of the NMOS transistor 31. The NMOS transistors 31 and 32 have sources commonly connected to the ground potential GND via a constant current circuit 35 and connected to the ground potential GND via a constant current circuit 36 and a switching NMOS transistor 37. The control signal SA is output via the drain of the NMOS transistor 32 while being delivered to the gate of the NMOS transistor 37 via an inverter 38.

As shown in FIG. 4B, the comparator 30B is identical with the comparator 30A except for the following. The NMOS transistor 31 receives the analog voltage AT via its gate while the NMOS transistor 32 receives the reference voltage VRq via its gate. The control voltage SB is output via the drain of the NMOS transistor 32 while being delivered to the gate of the NMOS transistor 37.

Figure 5:
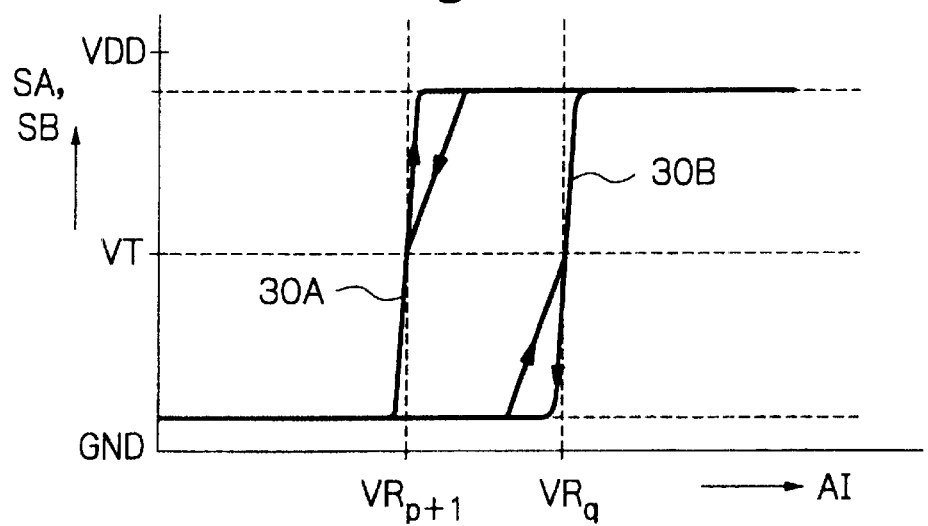
FIG. 5 plots the input-to-output characteristics of the comparators 30A and 30B shown in FIGS. 4A and 4B.

Reference will be made to FIG. 5 for describing the input-to-output characteristics of the comparators 30A and 30B respectively having the configurations shown in FIGS. 4A and 4B. In FIG. 5, the ordinate and abscissa respectively indicate the analog voltage AI input and the voltages of the control signals SA and SB output. As for the comparator 30A, if the analog voltage AI is lower than the reference voltage $VR_{p+1}$, then the NMOS transistor 31 is turned off while the NMOS transistor 32 is turned on, causing the control voltage SA output form the comparator 30A to go low. Because the control voltage SA is applied to the gate of the NMOS transistor 37 via the inverter 38 also, the NMOS transistor 37 is turned on. This increases the sum of currents flowing through the NMOS transistors 31 and 32 and thereby increases the amplification factor of the analog voltage AI around the reference voltage $V_{p+1}$. Consequently, the control voltage SA representative of the result of comparison sharply changes from a low level to a high level when the analog voltage AI rises above the reference voltage $VR_{p+1}$.

On the other hand, when the analog voltage AI rises above the reference voltage $V_{p+1}$ and causes the control voltage SA to go high, the NMOS transistor 37 is turned off. As a result, only the current of the constant current circuit 35 constitutes the sum of currents flowing through the NMOS transistors 31 and 32, so that the usual amplification factor is restored. Consequently, the control voltage SA slightly slowly changes from its high level to its low level when the analog voltage AI drops below the reference voltage $VR_{p+1}$.

In the other comparator 30B, the control voltage SB is directly applied to the gate of the NMOS transistor 37. Therefore, when the analog voltage AI is lower than the reference voltage VRq, the NMOS transistor 37 is turned off. When the analog voltage AI rises above the reference voltage VRq, the control voltage SB slightly slowly changes from its low level to its high level. On the other hand, when the analog voltage AI rises above the reference voltage VRq and causes the control voltage SB to go high, the NMOS transistor 37 is turned on. It follows that when the analog voltage AT drops below the reference voltage VRq, the control voltage SB sharply changes from its high level to its low level.

The comparators 30A and 30B with the above unique characteristics achieve an improved comparing function when the analog voltage AI is around the reference voltages $VR_{p+1}$ and VRq, respectively. Therefore, the control voltages SA and SB output from the comparators 30A and 30B, respectively, each are representative of an accurate, stable result of comparison.

Figure 6:
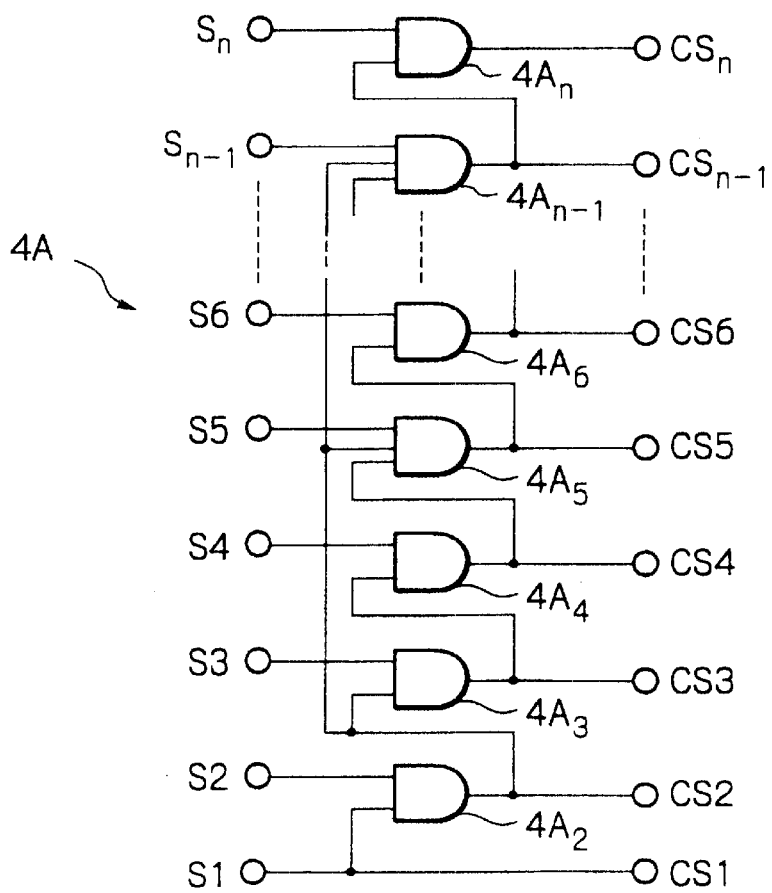
FIG. 6 is a schematic circuit diagram showing a specific configuration of an error correcting circuit further included in the illustrative embodiment.

A specific configuration of the error correcting circuit 4A, FIG. 1, will be described with reference to FIG. 6. As shown, the error correcting circuit 4A includes n−1 AND gates $4A_2$, $4A_3$, ..., $4A_n$ respectively receiving the signals S2 through Sn output from the data latch 3 via first inputs thereof. The AND gates $4A_3$ through $4A_n$ have second inputs each connected to the output of lower one of the AND gates $4A_2$ through $4A_{n-1}$, as illustrated. The signal S1 output from the data latch 3 is applied to the second input of the AND gate $4A_2$.

Some of the AND gates $4A_3$ through $4A_n$, e.g., the AND gates $4A_5$ and $4A_{n-1}$ have three inputs each, as illustrated. The lower AND gate $4A_2$, for example, has its output connected to the third inputs of the AND gates $4A_5$ and $4A_{n-1}$. The signal S1 output from the data latch 3 is directly output as the output CS1 of the error correcting circuit 4A. The AND gates $4A_2$ through $4A_n$ output the signals CS2 through CSn, respectively.

The operation of the illustrative embodiment will be described hereinafter with respect to three different levels of the analog voltage AI. First, assume that the analog voltage AI is lower than the reference voltage VRp+1 (AI<VRp+1). Then, both the control voltages SA and SB output from the comparators 30A and 30B are in the low level thereof. The control voltage SA remaining in its low level is applied to the control terminals of the comparators $10A_{q+1}$ through $10A_n$ assigned to the high level, maintaining the comparators $10A_{q+1}$ through $10A_n$ inoperative. Further, the control voltage SA is applied to the AND gates $43_{q+1}$ through $43_n$, so that all the signals Sq+1 through Sn representative of the results of comparison remain in a low level.

On the other hand, the control voltage SB remaining in its low level is applied to the comparators $10A_1$ through $10A_p$ assigned to the low level, maintaining the comparators $10A_1$ through $10A_p$ operative. The comparators $10A_{p+1}$ through $10A_q$ assigned to the medium level are fixedly connected to "H", as stated earlier. Under these conditions, the comparators $10A_1$ through $10A_q$ perform the following operation.

When the clock signal CK 1 output from the controller 2 is in its high level, each comparator $10A_j$ (j=1 through q) has its switch 11 turned off and has its switch 12 turned on, so that the analog voltage AI appears on the node N1. Further, the switch 15 is turned on to connect the input and output of the inverter 14 with the result that the input and output voltages of the inverter 14 become the threshold voltage VT which is substantially one half of the power source voltage VDD. Consequently, the capacitor 13 is charged to a voltage VT−AI. On the other hand, the inverter 21 has its PMOS transistor 21c and NMOS transistor 21d turned off and is therefore disconnected from the power source potential VDD and ground potential GND.

When the above clock signal CK1 goes low, the switch 15 of the comparator $10A_j$ is turned off and causes the inverter 14 to function as an inverting amplifier. In addition, the PMOS transistor 21c and NMOS transistor 21d of the inverter 21 are turned on. As a result, the power source voltage is fed to the inverter 21 and causes the three inverters 14, 20 and 21 to form an inverting amplifier circuit. On the other hand, because the switches 11 and 12 are turned on and turned off, respectively, the reference voltage $VR_j$ is applied to the node N1. At this time, the capacitor 13 has already been charged to the voltage VT−AI, so that a voltage VT−AI+VR is input to the inverter 14. Therefore, the output signal Cj of the comparator $10A_j$ is in its high level when a relation of AI>$VR_j$ holds or in its low level when a relation of AI<$VR_j$ holds. That is, the lower comparators $10A_j$ with respect to the analog voltage AI output high level signals Cj while the higher comparators $10A_j$ with respect to the same output low level output signals Cj.

The signals C1 through Cp respectively output from the comparators $10A_1$ through $10A_p$ assigned to the low level are fed to the data latch 3 via the OR gates $32_1$ through $32_p$ as signals S1 through Sp representative of the results of comparison. The signals Cp+1 through Cq respectively output from the comparators $10A_{p+1}$ through $10A_q$ assigned to the medium level are directly fed to the data latch 3 as signals Sp+1 through Sq also representative of the results of comparison. Further, the AND gates $43_{q+1}$ through $43_n$ output low levels as signals Sq+1 through Sn, respectively, representative of the results of comparison effected at the high level side.

As soon as the signals S1 through Sn become stable, the controller 2 outputs the clock signal CK2 with the result that the data latch 3 latches the above signals S1 through Sn. The signals S1 through Sn latched by the data latch 3 are delivered to the encoder 5 via the error correcting circuit 4A. The encoder 5 converts the signals S1 through Sn to binary digital data DO and outputs the digital data DO.

On the other hand, assume that the analog voltage AI is higher than or equal to the reference voltage, but lower than or equal to the reference voltage VRq (VRp+1≦AI≦VRq). Then, the control voltage SA output form the comparator 30A goes high while the control voltage SB output from the comparator 30B goes low. The high level control voltage SA is applied to the control terminals of the comparators $10A_{q+1}$ through $10A_n$, maintaining the comparators $10A_{q+1}$ through $10A_n$ operative. The low level control signal SB is applied to the control terminals of the comparators $10A_1$ through $10A_p$ assigned to the low level via the inverter 41, also maintaining the comparators $10A_1$ through $10A_p$ operative. The control terminals of the comparators $10A_{p+1}$ through $10A_q$ assigned to the medium level are connected to "H", as stated earlier. Consequently, all the comparators $10A_1$ through $10A_n$ perform the previously stated comparison. The results of comparison are routed through the data latch 3, error correcting circuit 4A and encoder 5 and converted to digital data DO thereby.

Assume that the analog voltage AI is higher than the reference voltage VRq (VRq<AI). Then, both the control voltages SA and SB output from the comparators 30A and 30B are in the high level thereof. In this condition, the comparators $10A_{q+1}$ through $10A_n$ assigned to the high level and the comparators $10A_{p+1}$ through $10A_q$ assigned to the medium level are maintained operative. However, the comparators $10A_1$ through $10A_p$ are rendered inoperative. As for the signals S1 through Sp representative of the results of comparison at the low level side, the OR gates $32_1$ through $32_p$ output high level signals.

As soon as the signals S1 through Sn become stable, the controller 2 outputs the clock signal K2. The signals S1 through Sn are routed through the data latch 3, error correcting circuit 4A and encoder 5 and converted to digital data DO thereby.

As stated above, the illustrative embodiment achieves the following unprecedented advantages (1) through (4).

(1) The comparators 30A and 30B divides the level of the analog signal AI. The control signals SA and SB output from the comparators 30A and 30B, respectively, control the operations of the comparators $10A_i$. This is successful to limit the number of comparators $10A_i$ to operate at the same time and therefore to reduce power consumption.

(2) Each comparator 10Ai has the inverters 14, 20 and 21 serially connected in three consecutive stages for implementing a high amplification factor. It follows that even when the difference between the analog voltage AI and the reference voltage VRi is small, the output voltage does not coincide with the threshold voltage VT, preventing a penetrating current from continuously flowing through, e.g., the inverter 14. In addition, the three inverters 14, 20 and 21 insure accurate comparison.

(3) in each of the comparators 30A and 30B, the constant current circuit 35 increase the current to be fed and therefore the amplification factor when the analog voltage lies in a decision range in level. The circuit 35 therefore insures a high response speed in the above condition or saves power when the analog voltages does not lie in the decision range.

(4) The error correcting circuit 4A includes not only a path along which the signals CS1 representative of the results of comparison are sequentially transferred to the higher a position, but also a path along which a particular signal CS1 is transferred to a particular higher position, by-passing a plurality of positions.

Figure 7:
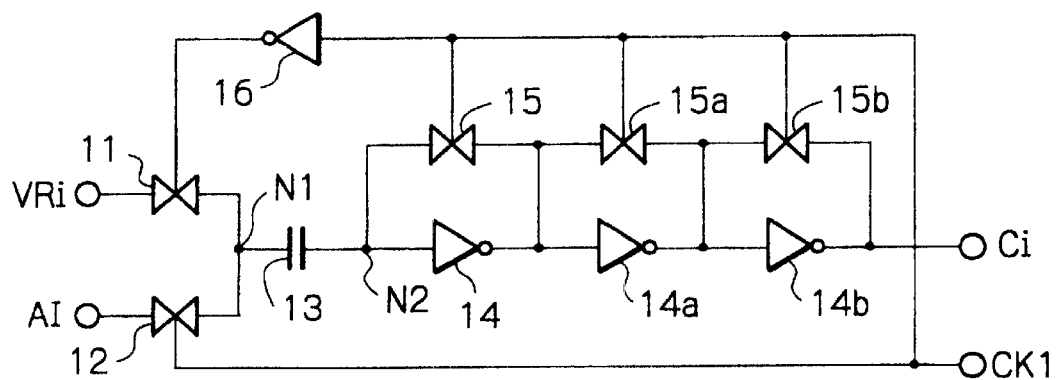
FIG. 7 is a schematic circuit diagram showing a comparator $10B_i$ representative of an alternative embodiment of the present invention.

Referring to FIG. 7, a comparator $10B_i$ in accordance with an alternative embodiment of the present invention will be described. The comparator $10B_i$ may be substituted for one comparator $10A_i$ shown in FIG. 1. In the figures, like structural elements are designated by identical reference numerals, and a detailed description thereof will not be made in order to avoid redundancy.

As shown in FIG. 7, the comparator $10B_i$, like the comparator $10A_i$, includes the switches 11 and 12 to which the reference voltage $VR_i$ and analog voltage AI, respectively, are input. The switches 11 and 12 have outputs connected to the node N1. The capacitor 13 is connected to the node N1 at one end and connected to the node N2 at the other end. The inverter 14 has its input connected to the node N2. The switch 15 is connected in parallel to the input and output of the inverter 4.

In the illustrative embodiment, an inverter 14a has an input connected to the output of the inverter 14 and has an output connected to the input of an inverter 14b. A switch 15a is connected in parallel to the inverter 14a while a switch 15b is connected in parallel to the inverter 14b. The signal Ci appears on the output of the inverter 14b. The switches 11, 12, 15, 15a and 15b are semiconductor switches each being adapted to turn on when the control signal is in its high level or turn off when it is in its low level.

Among the inverters 14, 14a and 14b, the inverter 14 has the greatest driving ability while the inverter 14a has the smallest driving ability. The comparator $10B_i$ does not include a control terminal. Therefore, when the comparator $10B_i$ is substituted for the comparator $10A_i$, FIG. 1, no control signals are connected to the comparator $10B_i$.

The operation of the comparator $10B_i$ is similar to the operation of the comparator $10A_i$ to occur when the control signal is in its high level. Specifically, when the clock signal k1 output from the controller 2 is in its high level, the switches 11 and 12 are respectively turned on and turned off, causing the analog voltage AI to appear on the node N1. Further, the switches 15, 15a and 15b are turned on to connect the inputs and outputs of the inverters 14, 14a and 14b, respectively. As a result, the input and output voltages of each of the inverters 14, 14a and 14b coincide with the threshold voltage VT which is substantially one half of the power source voltage VDD. Because the inverter 14 has the greatest driving ability, all the inverters 14, 14a and 14b output the threshold voltage VT.

When the clock signal CK1 goes low, the switches 15, 15a and 15b are turned off and cause the inverters 14, 14a and 14b to form an inverting amplifier circuit having a high amplification factor. On the other hand, the switches 11 and 12 are respectively turned on and turned off with the result that the reference voltage VRi is applied to the node N1. At this instant, because the capacitor 13 has already been charged to the voltage VT−AI, the voltage VT−AI+VRi is input to the inverter 14. Consequently, the signal S1 output from the inverter 14b and representative of the result of comparison goes high when the relation of AI>VRi holds or goes low when the relation of AI<VRi holds.

The comparator 10Bi with the above configuration has the following advantage in addition to the advantage of the previous embodiment. The inverter 14 located at the first stage has the greatest driving ability. Therefore, even when the threshold voltages of the inverters 14, 14a and 14b are different from each other, the threshold voltage VT of the inverter 14 appears on the node N2 without fail. The comparator 10Bi can therefore perform stable comparison.

In the embodiments shown and described, the switches 11 and 12 included in the comparator $10A_i$ or $10B_i$ receive the reference voltage VRi and analog voltage AT, respectively. Alternatively, the reference voltage VRi and analog voltage AT may be fed to the switches 12 and 11, respectively, in which case the logical circuitry connected to the output of the comparator $10A_i$ or $10B_i$ should be modified due to the reversal of the logical levels of the signal Ci.

If desired, the clock controlled inverter 21 of the comparator $10A_i$ may be replaced with an ordinary inverter. The comparators 30A and 30B each including the constant current circuit 36 and NMOS transistor 37 for switching the current in accordance with the signal SA or SB to output may be replaced with an ordinary differential comparator not including them.

The error correcting circuit 4A may be omitted in order to simplify the circuit arrangement, in which case the encoder 5 should preferably be constructed to detect errors. Further, an input selector implemented by the combination of analog switches may be connected to the analog voltage AI input side, so that one of a plurality of analog voltages to be converted can be selected.

In summary, it will be seen that the present invention provides an AD converter capable of stopping needless part of the comparison in accordance with the level of an analog signal input thereto and thereby reducing power consumption. Also, the apparatus features high comparison accuracy because it achieves a high amplification factor around a threshold voltage. Further, the apparatus stabilizes the threshold voltage and further enhances accurate comparison while obviating a penetrating current. Moreover, the apparatus has a high response speed and saves power when the level of the analog voltage does not lie in a decision range.

The entire disclosure of Japanese patent application No. 147510/1999 filed May 27, 1999 including the specification, claims, accompanying drawings and abstract of the disclosure is incorporated herein by reference in its entirety.

While the present invention has been described with reference to the illustrative embodiments, it is not to be restricted by the embodiments. It is to be appreciated that those skilled in the art can change or modify the embodiments without departing from the scope and spirit of the present invention.

What is claimed is:

1. An analog-to-digital (AD) converter comprising:
   a reference voltage generating circuit for dividing a voltage between a first and a second reference potential to thereby generate a plurality of low reference voltages of a low level, a plurality of high reference voltages of a high level, and a plurality of medium reference voltages of a medium level;
   a first voltage comparator supplied with a lower one of the plurality of medium reference voltages for comparing the lower medium reference voltage with an analog voltage input to said AD converter and outputting a first control signal if the analog voltage is higher than the lower medium reference voltage;
   a second voltage comparator supplied with a higher one of the plurality of medium reference voltages for comparing the higher medium reference voltage with the analog voltage and outputting a second control signal independently of the first control signal if the analog voltage is lower than the higher medium reference voltage;
   a plurality of low reference voltage comparators each for comparing, in response to the second control signal, a particular one of the plurality of low reference voltages with the analog voltage;
   a plurality of medium reference voltage comparators each for comparing a particular one of the plurality of medium voltages with the analog voltage;
   a plurality of high reference voltage comparators each for comparing, in response to the first control signal, a particular one of the plurality of high reference voltages with the analog voltage; and
   a data outputting circuit for generating and outputting digital data corresponding to the analog voltage on the basis of results of comparison output from said low reference voltage comparators, said medium reference voltage comparators, and said high reference voltage comparators.

2. An AD converter in accordance with claim 1, wherein said low reference voltage comparators and said high reference voltage comparators each comprise:
   a first and a second switch for applying, in response to the first control signal or the second control signal, the low reference voltage and the analog voltage alternately to a first node in accordance with a clock signal;
   a capacitor connected between the first node and a second node;
   a first CMOS (Complementary Metal Oxide Semiconductor) inverter for comparing a voltage appearing on the second node with a threshold voltage;
   a third switch for short-circuiting, in response to the first control signal or the second control signal, an input and an output of said first CMOS inverter in accordance with the clock signal to apply the threshold voltage to the second node; and
   at least one second CMOS inverter serially connected to the output of said first CMOS inverter for outputting a signal representative of the result of comparison.

3. An AD converter in accordance with claim 2, wherein said first CMOS inverter has a greater driving ability than said second CMOS inverter.

4. An AD converter in accordance with claim 2, wherein said second CMOS inverter has power supply thereto ON/OFF controlled by the clock signal and is supplied with power only when outputting a signal representative of the result of comparison.

5. An AD converter in accordance with claim 2, wherein said first voltage comparator comprises:
   a first differential amplifier circuit comprising a first transistor having a conduction state controlled by the lower medium reference voltage and a second transistor connected in parallel to said first transistor and having a conduction state controlled by the analog voltage, said first differential amplifier circuit outputting the first control signal on the basis of the conduction state of said first transistor and the conduction state of said second transistor;
   a first constant current circuit for constantly feeding a first constant current to said first differential amplifier circuit; and
   a second constant current circuit for feeding a second constant current to said first differential amplifier circuit when the first control signal is not output;
   said second voltage comparator comprising:
   a second differential amplifier comprising a third transistor having a conduction state controlled by the higher medium reference voltage and a fourth transistor connected in parallel to said third transistor and having a conduction state controlled by the analog voltage, said second differential amplifier outputting the second control signal on the basis of the conduction state of said third transistor and the conduction state of said fourth transistor; and
   a third constant current circuit for constantly feeding a third constant current to said second differential amplifier circuit; and
   a fourth constant current circuit for feeding a fourth constant current to said second differential amplifier circuit when the second control signal is output.

6. An AD converter in accordance with claim 1, wherein said low reference voltage comparators and said high reference voltage comparators each comprise:
   a first and a second switch for applying the low reference voltage, the medium reference voltage or the high reference voltage and the analog voltage alternatively to the first node in accordance with a clock signal;
   a capacitor connected between the first node and a second node;
   a first CMOS inverter for comparing a voltage appearing on the second node with a threshold voltage;
   a third switch for short-circuiting an input and an output of said first CMOS inverter in accordance with the clock signal to apply the threshold voltage to the second node;
   at least one second CMOS inverter serially connected to the output of said first CMOS inverter; and
   a logical gate for outputting, in response to the first control signal or the second control signal, an output signal of said second CMOS inverter as a signal representative of the result of comparison.

7. An AD converter in accordance with claim 6, wherein said first CMOS inverter has a greater driving ability than said second CMOS inverter.

8. An AD converter in accordance with claim 7, wherein said second CMOS inverter has power supply thereto ON/OFF controlled by the clock signal and is supplied with power only when outputting a signal representative of the result of comparison.

9. An AD converter in accordance with claim 8, wherein said first voltage comparator comprises:
   a first differential amplifier circuit comprising a first transistor having a conduction state controlled by the lower medium reference voltage and a second transistor connected in parallel to said first transistor and having a conduction state controlled by the analog voltage, said first differential amplifier circuit outputting the first control signal on the basis of the conduction state of said first transistor and the conduction state of said second transistor;

a first constant current circuit for constantly feeding a first constant current to said first differential amplifier circuit; and a second constant current circuit for feeding a second constant current to said first differential amplifier circuit when the first control signal is not output;

said second voltage comparator comprising:

a second differential amplifier comprising a third transistor having a conduction state controlled by the higher medium reference voltage and a fourth transistor connected in parallel to said third transistor and having a conduction state controlled by the analog voltage, said second differential amplifier outputting the second control signal on the basis of the conduction state of said third transistor and the conduction state of said fourth transistor; and a third constant current circuit for constantly feeding a third constant current to said second differential amplifier circuit; and a fourth constant current circuit for feeding a fourth constant current to said second differential amplifier circuit when the second control signal is output.

10. An AD converter in accordance with claim 7, wherein said first voltage comparator comprises:

a first differential amplifier circuit comprising a first transistor having a conduction state controlled by the lower medium reference voltage and a second transistor connected in parallel to said first transistor and having a conduction state controlled by the analog voltage, said first differential amplifier circuit outputting the first control signal on the basis of the conduction state of said first transistor and the conduction state of said second transistor;

a first constant current circuit for constantly feeding a first constant current to said first differential amplifier circuit; and a second constant current circuit for feeding a second constant current to said first differential amplifier circuit when the first control signal is not output;

said second voltage comparator comprising:

a second differential amplifier comprising a third transistor having a conduction state controlled by the higher medium reference voltage and a fourth transistor connected in parallel to said third transistor and having a conduction state controlled by the analog voltage, said second differential amplifier outputting the second control signal on the basis of the conduction state of said third transistor and the conduction state of said fourth transistor; and a third constant current circuit for constantly feeding a third constant current to said second differential amplifier circuit; and a fourth constant current circuit for feeding a fourth constant current to said second differential amplifier circuit when the second control signal is output.

11. An AD converter in accordance with claim 6, wherein said second CMOS inverter has power supply thereto ON/OFF controlled by the clock signal and is supplied with power only when outputting a signal representative of the result of comparison.

12. An AD converter in accordance with claim 11, wherein said second CMOS inverter has power supply thereto ON/OFF controlled by the clock signal and is supplied with power only when outputting a signal representative of the result of comparison.

13. An AD converter in accordance with claim 6, wherein said first voltage comparator comprises:

a first differential amplifier circuit comprising first transistor having a conduction state controlled by the lower medium reference voltage and a second transistor connected in parallel to said first transistor and having a conduction state controlled by the analog voltage, said first differential amplifier circuit outputting the first control signal on the basis of the conduction state of said first transistor and the conduction state of said second transistor;

a first constant current circuit for constantly feeding a first constant current to said first differential amplifier circuit; and a second constant current circuit for feeding a second constant current to said first differential amplifier circuit when the first control signal is not output;

said second voltage comparator comprising:

a second differential amplifier comprising a third transistor having a conduction state controlled by the higher medium reference voltage and a fourth transistor connected in parallel to said third transistor and having a conduction state controlled by the analog voltage, said second differential amplifier outputting the second control signal on the basis of the conduction state of said third transistor and the conduction state of said fourth transistor; and a third constant current circuit for constantly feeding a third constant current to said second differential amplifier circuit; and a fourth constant current circuit for feeding a fourth constant current to said second differential amplifier circuit when the second control signal is output.

14. An AD converser in accordance with claim 1, wherein said first voltage comparator comprises:

a first differential amplifier circuit comprising a first transistor having a conduction state controlled by the lower medium reference voltage and a second transistor connected in parallel to said first transistor and having a conduction state controlled by the analog voltage, said first differential amplifier circuit outputting the first control signal on the basis of the conduction state of said first transistor and the conduction state of said second transistor;

a first constant current circuit for constantly feeding a first constant current to said first differential amplifier circuit; and a second constant current circuit for feeding a second constant current to said first differential amplifier circuit when the first control signal is not output;

said second voltage comparator comprising:

a second differential amplifier comprising a third transistor having a conduction state controlled by the higher medium reference voltage and a fourth transistor connected in parallel to said third transistor and having a conduction state controlled by the analog voltage, said second differential amplifier outputting the second control signal on the basis of the conduction state of said third transistor and the conduction state of said fourth transistor; and a third constant current circuit for constantly feeding a third constant current to said second differential amplifier circuit; and a fourth constant current circuit for feeding a fourth constant current to said second differential amplifier circuit when the second control signal is output.

* * * * *